United States Patent [19]

Tarchalski et al.

[11] 4,038,584

[45] July 26, 1977

[54] PROTECTIVE ARRANGEMENT FOR DEPENDENT SWITCHING CIRCUITS

[75] Inventors: Edward Tarchalski, Lawrenceville; John C. Wilkinson, Hightstown, both of N.J.

[73] Assignee: Heinemann Electric Company, Trenton, N.J.

[21] Appl. No.: 696,211

[22] Filed: June 15, 1976

[51] Int. Cl.² .............................................. H02H 7/20
[52] U.S. Cl. ................................. 361/104; 307/252 B; 361/206; 307/326; 361/2; 361/205
[58] Field of Search ...................... 317/40 A, 41, 40 R, 317/33 S, 33 VR, 33 R; 307/92, 134, 135, 252 B, 252 N, 202 R

[56] References Cited

U.S. PATENT DOCUMENTS

| | | | |
|---|---|---|---|
| 3,328,606 | 6/1967 | Pinckaers | 307/252 B |
| 3,723,769 | 3/1973 | Collins | 307/252 N X |
| 3,761,734 | 9/1973 | Windecker | 307/252 B X |
| 3,881,118 | 4/1975 | Forrest et al. | 307/252 B X |
| 3,917,962 | 11/1975 | Pascente | 307/252 B X |

*Primary Examiner*—J. D. Miller
*Assistant Examiner*—Patrick R. Salce
*Attorney, Agent, or Firm*—Joseph G. Denny, III; Peter J. Patane

[57] ABSTRACT

This invention comprises a fusible resistor in a solid state relay comprising two solid state switches connected in parallel with each other, but in series with a load and a source of current. When the first of the two switches is switched on, the second switch also switches on, and conducts, supplying sufficient current to the load, thus reducing the voltage across both switches to that of the voltage drop across the second switch. Should the second switch fail to become turned on when the first switch is turned on, there will be a higher voltage across the first switch (and the components in series with it, if any) causing excessive current to flow through the first switch, resulting in its overheating and possibly fire, particularly if the switch is encapsulated. By providing a fusible resistor in the circuit of the first switch, the fusible resistor will open at such time and disconnect the first switch from the circuit, preventing a possible fire or possible damage to adjacent equipment.

12 Claims, 1 Drawing Figure

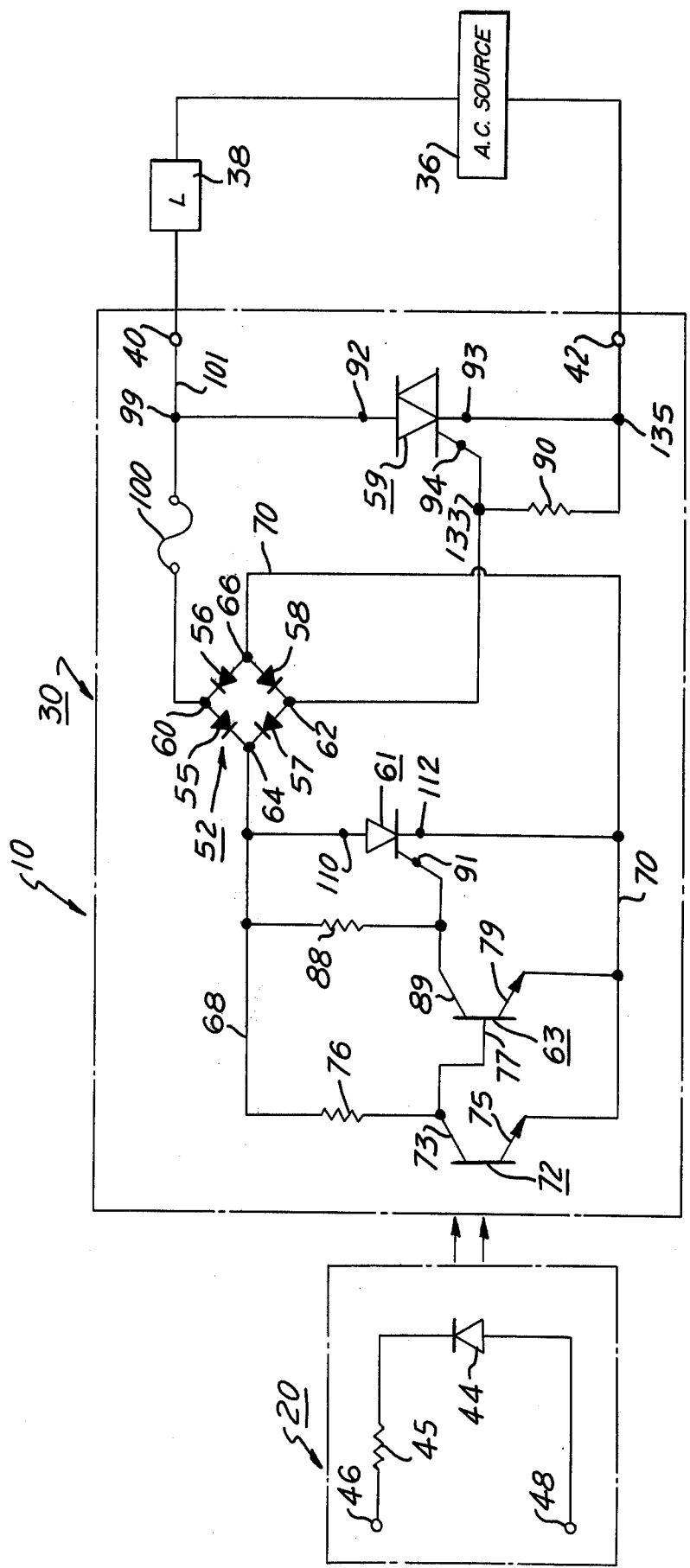

PROTECTIVE ARRANGEMENT FOR DEPENDENT SWITCHING CIRCUITS

BACKGROUND OF THE INVENTION

This invention relates to solid state relays and, in particular, to encapsulated solid state relays in which the internal components of the relays are embedded in suitable plastic materials.

If one or more of the embedded components overheats due to being supplied with a current larger than that for which it is intended, adequate heat dissipation may not take place and the component may be destroyed and/or a fire may result.

BRIEF SUMMARY OF THE INVENTION

It is an object of this invention to provide a fusible resistor in a solid state relay of the encapsulated type for the dual purposes of terminating the excessive current to one of the switches, so as to prevent a possible fire and possible damage to adjacent equipment and for limiting the flow of current to the other of the switches when the latter is non-conductive.

The invention provides two solid state switches, the first of which triggers the second to the fully conductive or on condition. The two switches are connected in parallel with each other and in series with a load and a source of current.

A fusible resistor is placed in series with the first switch and in the circuit which triggers the second switch to the on condition, so that the resistive feature of the fusible resistor limits the current flow in the triggering circuit of the second switch.

If for any reason the second switch does not become fully conductive, i.e. does not turn on, when the first switch becomes conductive, the higher current which would now flow through the first switch must flow through the fusible resistor and the first switch. The fusible resistor is such as to open the circuit at such time, avoiding the possibility of overheating of the first switch and a possible fire.

The foregoing object of this invention, the principles of this invention and the best modes in which we have contemplated applying such principles will more fully appear from the following description and accompanying drawing in illustration thereof.

BRIEF DESCRIPTION OF THE VIEW

The drawing is a schematic illustration of a solid state relay incorporating this invention.

DESCRIPTION OF THE PREFERRED EMBODIMENT

Referring to the drawing, the preferred embodiment of our invention is shown incorporated in a solid state relay 10. In general, the relay 10 includes a control (or input) portion 20 and a load current (or output) portion 30. The load current is supplied from a suitable alternating current source 36 to energize a load 38. The relay 10 includes a pair of load current terminals 40 and 42 by which it may be connected to the load 38 and the source 36, as shown. The control portion 20 is substantially electrically isolated from the load current portion 30 due to the lack of any direct electrical connection between these two portions.

In the control portion 20 a suitable electrical control signal is applied to a photon generator 44 through a pair of control signal input terminals 46 and 48. The photon generator 44 may be, for example, a light-emitting diode and is hereinafter referred to as LED 44 and is provided with a current limiting resistor 45. (An optional diode, not shown, may be connected inversely in parallel with the LED 44 to protect the LED 44 from reverse bias voltages, as is well known.)

In the load current portion 30, a single phase, full wave diode rectifier bridge 52 rectifies the alternating current applied at the load current terminals 40 and 42 and produces, at the output terminals 64 and 66, a direct current of a voltage related to the absolute value of the alternating current voltage supplied at the load current terminals 40 and 42, as is well known in the art. The rectifier bridge 52 comprises diodes 55, 56, 57 and 58 connected in a manner well known in the art to form a full wave rectifier bridge. Input terminals 60 and 62 to the diode bridge 52 are connected to the load current terminals 40 and 42, respectively, as shown. Also, the direct current output terminals 64 and 66 of the diode bridge 52 are connected to the conductors 68 and 70, as shown.

The output circuit 30 also comprises a triac 59 and a silicon controlled rectifier, i.e., SCR, 61. The output circuit 30 further includes a photon activated switch, for example, a light activated transistor 72 which switches or turns off a normally conductive transistor 63 which (when the output circuit is off) shunts the SCR 61, the transistor 72 being optically coupled to the LED 44.

Triac 59 includes primary or main terminals 92 and 93 and a gate terminal 94. As is well known to those skilled in the art, the triac 59 operates as though it were two conventional silicon controlled rectifiers connected in opposite polarity and having their gate terminals tied together. Thus, when triggered into conduction, the triac 59 can conduct current in either direction and it can be triggered into conduction by a signal of either polarity being applied to the gate terminal 94. As in the case of silicon controlled rectifiers, once the triac 59 conducts, the gate terminal 94 loses all control over its conduction, and the conduction continues until the voltage impressed across the main terminals 92 and 93 is removed. However, when a triac such as triac 59 is used in an alternating current circuit, the triac is self extinguishing after each half cycle, unless a triggering signal is maintained at the gate terminal 94, since the necessary principal voltage is effectively removed from the triac each time the alternating current passes through zero while reversing its polarity.

When the output circuit 30 is off, the transistor 72 is off, the transistor 63 is on and the SCR 61 and the triac 59 are both off. When the output circuit 30 is on, the transistor 72 is on, the transistor 63 is off, and the SCR 61 and the triac 59 are both on.

Assuming that the transistor 72 is receiving insufficient energy from the LED 44 to turn it on, the transistor 72 is then off and no current is flowing between its collector 73 and its emitter 75. At such time, however, a sufficient bias is applied to the base 77 of the transistor 63 (due to the voltage drop across the resistor 76) and a current path is established through the resistor 76, the base 77, the emitter 79, the diode 58 of the bridge 52, a resistance 90 and the terminal 42, whereby current also flows through a resistor 88, the collector 89 and the emitter 79 of the transistor 63, through the diode 58 of the bridge 52 and through the resistor 90. Since the collector 89 of the transistor 63 is connected to the gate 91 of the SCR 61, the SCR 61 is biased off at such time, resulting in the triac 59 being biased off also.

The full wave rectifier 52 is connected in series with a current limiting fusible resistor 100 between the main terminal 92 of the triac 59 (at the junction 99) and the gate terminal 94 of the triac 59. The input terminal 60 of the full wave rectifier 52 is connected to one end of the fusible resistor 100 whose other end is electrically connected at the junction 99 to the main terminal 92 and the load terminal 40.

SCR 61 is connected between the direct current output terminals 64 and 66 of the full wave rectifier 52 and has an anode terminal 110 which is connected to the output terminal 64 and has a cathode terminal 112 which is connected to the output terminal 66. The collector 89 of the transistor 63 is also connected to the gate terminal 91 of the SCR 61.

The relay 10 operates as follows. Assuming that the triac 59 is not conducting, at this time essentially all of the alternating current voltage to be controlled appears across terminals 40 and 42. A series circuit exists between the terminals 40 and 42 through the fusible resistor 100, the full wave rectifier 52, the anode 110 and cathode 112 of the silicon controlled rectifier 61 and the internal portion of the triac 59 between the gate terminal 94 and the main terminal 93. The effective resistance of this path is equal to the sum of the resistance of the fusible resistor 100, the anode 110 and cathode 112 resistance of the silicon controlled rectifier 61, and the gate 94 and main terminal 93 resistance of the triac 59. The value of the fusible resistor 100 and the characteristics of the triac 59 and the silicon controlled rectifier 61 may be selected such that the sum of these resistances limits the current flowing in the gate terminal 94 to a value less than that required to trigger the triac 59 into conduction, it being well known that triacs require a relatively high value of gating signal to be triggered into conduction.

However, there is the possibility that leakage currents flowing through the transistors 63 and 72 and the SCR 61 may be sufficient to accumulate at the gate 94 and fire the triac 59 when it is not intended to be fired. To avoid this possibility, the resistor 90 is connected between the gate 94 and the main terminal 93 to shunt such leakage currents around the triac 59.

Because of the use of the full wave rectifier 52, a positive volage always exists between the anode 110 and cathode 112 of the silicon controlled rectifier 61, regardless of the polarity of the alternating current voltage applied to the terminals 40 and 42. If a gating signal is applied from the transistor 63 through collector 89 and to the gate terminal 91 and cathode 112 of the silicon controlled rectifier 61, it is triggered into conduction and its internal resistance drops abruptly to a near zero value. At this time, the strength of the signal being applied to the gate terminal 94 of the triac 59, which signal is derived from the power being applied to terminals 40 and 42 by the alternating current voltage being controlled (and not from the low level gating signal being applied through the collector 89) is limited by the current limiting fusible resistor 100 and the value of this resistor is selected so that the signal being applied to the gate terminal 94 is easily sufficient to trigger the triac 59 into conduction, but is not sufficient to cause any internal damage to the triac 59.

The triac 59 thus becomes triggered into conduction, at which time the gate terminal 94 loses control of the triac 59 and the conduction continues until half of the alternating current cycle is completed, at which time conduction through the triac is self extinguishing. However, if the gating signal is still being applied to the gate terminal 94 of the silicon controlled rectifier 61 at the beginning of the subsequent half cycle of the voltage, the triac 59 is again triggered into conduction for the following half cycle, and this pattern continues for as long as the gating signal remains on the gate terminal 94.

All of the elements of the relay 10 are fully encapsulated or potted within a solid body (not shown) made from plastic material preferably an epoxy material with a high thermal conducting characteristic, except for the terminals 40, 42, 46 and 48 which are only partially embedded in the epoxy. Thus, when the fusible resistor 100 does fuse, it is not intended that it should be replaced, because it is embedded in the plastic body. Likewise, since the triac 59 is embedded in the plastic body, if it does fail, it is not intended to be replaced.

The fusible resistor 100 has been disclosed in series with the input terminal 60 between the main terminal 92 and the input terminal 60, because its resistance feature will limit the current should one of the other components short out. For example, if the diode 57 were to short out, the fusible resistor 100 would continue to limit the current to the gate 94 of the triac to a safe level. While the triac 59 would be continuously biased on thereafter, it would not overheat to the point where it might cause a fire.

The fusible resistor 100 may be placed in series with the SCR 61 and the direct current output terminals 64 and 66 or between the input terminal 62 and the gate 94 and in both of these locations, the open circuit failure of the triac 59 will impose a sufficiently high current on the fusible resistor 100 to cause it to open. However, only if the resistor 100 is placed in the load circuit, i.e., either as shown or between the terminal 62 and the resistor 90, will the resistor 100 limit the current to the triac 59 on the short circuit failure of any of the other elements of the load current portion 30 of the relay 10.

The fusible resistor 100 is placed between the input terminal 60 and the junction 99 of the main terminal 92 with the conductor 101 which is connected to the load terminal 40. In this position the fusible resistor provides a resistance sufficient to limit the flow of current to the gate 94 to a level below the firing level which would place the triac 59 in conduction, assuming that the SCR 61 is then non-conductive. Also, in this position, the fusible resistor 100 has impressed on it only a pulse of current for a short period of time, during the firing of the triac 59, and this pulse is insufficient to fuse the resistor 100.

While the preferred position of the fusible resistor 100 is as shown, it could also be placed between the input terminal 62 and the junction 133. It may not be placed between the junction 133 and the gate 94, because the resistor 90 would provide an alternate path upon fusing of the fusible resistor 100.

The fusible resistor 100 may alternately be placed between the output terminal 64 and the anode 110 of the SCR 61 or between the cathode 112 and the output terminal 66, but in such positions it would fuse in response to an open circuit across the triac 59, but would not provide the resistance to limit the current upon a short circuit condition in the full wave rectifier 52.

Also, the purpose of this invention would not be served if the fusible resistor was placed between the load terminals 40 and 42 and the load, in the circuit leg between the main terminal 92, the junction 99 and the load terminal 40, or in the circuit leg between the main terminal 93, the junction 135 and the load terminal 42, as in all of these possible positions the fusible resistor would have to carry the load current and, hence, would not sense an increase in current through the SCR 61 when the load current attempts to flow through the SCR 61, instead of the triac 59, upon the triac 59 becoming open circuited.

Further, the fusible resistor 100 should not be placed between the junction 133 and the gate 94, as the resistor 90 would provide a shunt path around the fusible resistor 100, defeatig the purpose of the latter. Likewise, the fusible resistor 10 should not be placed between the junctions 133 and 135 as its purpose would be defeated by the shunt path through the gate 94 and the main terminal 93.

From the foregoing it is seen that a solid state relay has been provided which incorporates a fusible resistor 100 in series with an SCR 61 which, on switching of the SCR 61, actuates the triac 59 all of which are encapsulated in a body of plastic material (not shown). Should the triac 59 fail to switch on when the SCR 61 has been activated to conduct, the SCR 61, the fusible resistor 100, and the bridge rectifier 52, would be across the supply voltage permanently until the fusible resistor 100 fused and opened the circuit. Under normal conditions, when the triac 59 conducts, the voltage across the SCR 61, the fusible resistor 100, and the bridge 52 is reduced to the small voltage drop across the triac 59 in its conducting state. Also, during normal operation of the relay, when the SCR 61 conducts, the SCR 61, the fusible resistor 100, and the bridge 52 are exposed to the supply voltage only for the duration of the triac switching period which is in the order of microseconds.

What we claim is:

1. An alternating current solid state relay circuit comprising
    a pair of load terminals connectable in series with a load and in series with an alternating current power source,
    a triac having first and second main terminals and a gate terminal,
    means for connecting said triac main terminals to said load terminals and thereby to the alternating current to be controlled,
    a full wave rectifier having alternating current input terminals and direct current output terminals,
    said full wave rectifier input terminals being connected between said first main terminal of said triac and said gate terminal of said triac,
    a fusible resistor connected between said first main terminal of said triac and one of the input terminals of said full wave rectifier,
    a silicon controlled rectifier connected between said direct current terminals of said full wave rectifier, and
    an optically controlled means responsive to a control signal for rendering said silicon controlled rectifier conductive and thereby also triggering said triac into conduction,
    whereby said fusible resistor limits the current to said triac and also opens the circuit when it fuses should said triac fail open.

2. The combination of claim 1 and further including a body of plastic material within which are permanently encapsulated said triac, said silicon controlled rectifier, said full wave rectifier and said fusible resistor.

3. The combination of claim 2 wherein said optically controlled means includes a light emitting diode, input terminal means connected to said light emitting diode and connectable to a signal source for energizing said light emitting diode, a light energizable transistor coupled to said light emitting diode, said light energizable transistor having collector and emitter terminals connected to said direct current output terminals, and a second transistor also having collector and emitter terminals connected to said direct current output terminals of said rectifier and a base terminal connected to said collector terminal of said light energizable transistor.

4. A solid state relay for switching an alternating load current controlled by a current signal comprising
    a first solid state switch having a gate and two main terminals,
    said first solid state switch being connectable to an alternating current load and an alternating current source,
    a full wave rectifier having alternating current input terminals and direct current output terminals,
    said alternating current input terminals of said full wave rectifier being connected to said first solid state switch and connectable to said alternating current load and said alternating current source,
    a second switch connected to the direct current output of said full wave rectifier,
    a fusible resistor connected to one of the input terminals of said full wave rectifier and to one of the terminals of said first solid state switch,
    said first solid state switch having said gate terminal connected to one of the output terminals of said full wave rectifier,
    said fusible resistor having a sufficiently high resistance together with the resistances of said second switch when non-conductive and said full wave rectifier to bias said first solid state switch to its non-conductive state when said second switch is non-conductive and to limit the current through said second switch when conductive,
    a current signal control means for applying a bias to said second switch to render said second switch conductive on predetermined conditions, and
    said fusible resistor having a fusing valve which will fuse and open the circuit upon an open circuit condition existing across said first solid state switch.

5. The combination recited in claim 4 and further including a solid body of plastic material within which said switches, said full wave rectifier, said fusible resistor, and said direct current signal control means are embedded.

6. The combination recited in claim 5 wherein said fusible resistor is connected betwen one of the input terminals of said full wave rectifier and to one of the main terminals of said first solid state switch.

7. The combination recited in claim 5 wherein said fusible resistor is connected between one of the input terminals of said full wave rectifier and to said gate terminal of said first solid state switch.

8. The combination recited in claim 5 wherein said fusible resistor is connected between one of the output terminals of said full wave rectifier and to said second switch.

9. A solid state relay for switching an alternating load current controlled by a current signal comprising
    a first solid state switch, said first solid state switch being connectable to an alternating current load and an alternating current source, a rectifier having alternating current input terminals and direct current output terminals, said alternating current input terminals of said rectifier being connected to said first solid state switch and connectable to said alternating current load and said alternating current source, a second solid state switch connected to the direct current output of said rectifier, a fusible resistor connected to one of input terminals of said rectifier and to one of the terminals of said first solid state switch, said first solid state switch being connected to one of the output terminals of said rectifier, a signal control means for applying a bias to said second solid state switch to render said second solid state switch conductive on predetermined conditions, said fusible resistor having a fusing value which will fuse and open the circuit upon an open circuit condition existing across said first solid state switch, and a solid body of plastic material within which said first and second solid state switches, said rectifier, said fusible resistor, and said direct current signal control means are embedded.

10. The combination of claim 9 wherein
said fusible resistor has a sufficiently high resistance together with the resistances of said second switch when non-conductive and said full wave rectifier to bias said first solid state switch to its non-conductive state when said second solid state switch is non-conductive and to limit the current through said second switch when conductive.

11. A relay for switching a load current controlled by a current comprising a first switch, said first switch being connectable in series with a load and to a current source, a second switch connected in parallel with said first switch and in series with said load, a fuse connected in series with said second switch and said load, said fuse in series with said second switch being connected in parallel with said first switch, said switches being normally both non-conductive or both normally conductive, a signal control means rendering said second switch conductive, conduction of said first switch being dependent on conduction of said second switch in normal operation, said fuse having a fusing value which will fuse and open the circuit upon the failure of the first switch to become conductive.

12. The combination of claim 11 and a solid body of plastic material within which said switches, said fuse and said signal control means are embedded.

* * * * *